United States Patent [19]
Debbins et al.

[11] Patent Number: 6,166,544
[45] Date of Patent: Dec. 26, 2000

[54] MR IMAGING SYSTEM WITH INTERACTIVE IMAGE CONTRAST CONTROL

[75] Inventors: Josef P. Debbins; Roshy J. Francis; Richard J. Prorok, all of Waukesha, Wis.

[73] Assignee: General Electric Company, Schenectady, N.Y.

[21] Appl. No.: 09/200,158

[22] Filed: Nov. 25, 1998

[51] Int. Cl.⁷ ........................................................ G01V 3/00
[52] U.S. Cl. .............................................. 324/309; 324/314
[58] Field of Search ............................. 324/300, 306, 324/307, 309, 314, 318, 322, 312

[56] References Cited

U.S. PATENT DOCUMENTS

| | | | |
|---|---|---|---|
| 4,707,797 | 11/1987 | Briggs | 324/307 |
| 4,830,012 | 5/1989 | Riederer | 128/653 |
| 5,345,176 | 9/1994 | LeRoux et al. | 324/309 |
| 5,451,876 | 9/1995 | Sandford et al. | 324/322 |
| 5,498,963 | 3/1996 | Schneider et al. | 324/309 |
| 5,512,827 | 4/1996 | Hardy et al. | 324/309 |
| 5,541,513 | 7/1996 | Maier | 324/309 |
| 5,560,361 | 10/1996 | Glusick | 128/653.2 |
| 5,584,293 | 12/1996 | Darrow et al. | 128/653.2 |
| 5,606,258 | 2/1997 | Hoenninger, III et al. | 324/309 |
| 5,657,757 | 8/1997 | Hurd et al. | 128/653.2 |
| 5,711,300 | 1/1998 | Schneider et al. | 128/653.2 |
| 5,749,834 | 5/1998 | Hushek | 600/410 |
| 5,810,729 | 9/1998 | Hushek et al. | 600/410 |

FOREIGN PATENT DOCUMENTS

| | | |
|---|---|---|
| 567794 | 11/1993 | European Pat. Off. . |
| WO 9100530 | 1/1991 | WIPO . |
| WO 9534242 | 12/1995 | WIPO . |

*Primary Examiner*—Louis Arana
*Attorney, Agent, or Firm*—Foley & Lardner

[57] ABSTRACT

A magnetic resonance (MR) imaging system equipped with real-time imaging capability and methods of interactively prescribing image contrast are disclosed herein. The MR imaging system includes a sequence controller for constructing MR imaging pulse sequences and a waveform memory for storing waveform segments. The MR imaging system allows an operator to interactively prescribe image contrast mechanism prior to and/or during real-time imaging. The use of image contrast waveform segments, only as needed, minimizes unnecessary MR scan time.

24 Claims, 4 Drawing Sheets

MR IMAGING SYSTEM WITH INTERACTIVE IMAGE CONTRAST CONTROL

FIELD OF THE INVENTION

The present invention relates generally to magnetic resonance (MR) imaging systems. More particularly, the present invention relates to a MR imaging system equipped for real-time imaging and which allows interactive modification of the image contrast of MR images produced therein.

BACKGROUND OF THE INVENTION

When a substance such as human tissue is subjected to an uniform magnetic field (polarizing field Bo), the individual magnetic moments of the spins in the tissue attempt to align with this polarizing field, but process about it in random order at their characteristic Larmor frequency. If the substance, or tissue, is subjected to a magnetic field (excitation field $B_1$) which is the x-y plane and which is near the Larmor frequency, the net aligned moment, $M_z$, may be rotated, or "tipped", into the x-y plane to produce a net transverse magnetic moment M. A signal is emitted by the excited spins after the excitation signal $B_1$ is terminated and this signal may be received and processed to form an image.

When utilizing these signals to produce images, magnetic field gradients ($G_x$, $G_y$ and $G_z$,) are employed. Typically, the region to be imaged is scanned by a sequence of measurement cycles in which these gradients vary according to the particular localization method being used. The resulting set of received NMR signals (also referred to as MR signals) are digitized and processed to reconstruct the image using one of many well known reconstruction techniques.

When viewing an MR image of a structure of interest, such as an anatomical section, the MR imaging system operator may desire to view an MR image in which one or more types of tissue comprising the anatomical section is contrasted with respect to the remaining types of tissue of the anatomical section. Moreover, the operator may desire to modify the image contrast of an MR image acquisition in progress or to prescribe the image contrast prior to an MR image acquisition.

Currently, various image contrast mechanisms such as chemical saturation and spatial saturation are used in MR imaging to generate images of varying contrast. For example, chemical saturation is used to suppress the relatively large magnetization signal from fatty tissue. Each image contrast mechanism is made possible by a corresponding magnetization preparation applied to the anatomical section prior to the MR scan. Briefly, magnetization preparation involves preparing the spin state in the bore such that the anatomical section to be imaged is in a certain magnetized state immediately before the regular image scanning commences. Thus, to acquire an MR image with image contrast, the MR imaging system executes an MR imaging pulse sequence comprised of at least two sets of waveform segments—at least one set of image contrast waveform segment and a set of (regular) imaging waveform segment.

In conventional MR imaging systems, the MR imaging pulse sequence responsible for a specific image contrast mechanism is typically constructed and stored in the MR imaging system prior to scanning. In particular, the MR imaging pulse sequence is comprised of the specific image contrast waveform segment permanently linked to the imaging waveform segment, thus one waveform set. When an operator desires this specific image contrast mechanism, this all-inclusive pulse sequence is evoked and executed in its entirety. The drawback of this type of pulse sequence architecture is that the operator must wait until the image acquisition in progress is completed before new desired image contrast mechanism(s) can be applied. Furthermore, even if the amplitudes of the image contrast waveform segment of the MR imaging pulse sequence can be set to zero while the image acquisition is in progress, essentially prescribing a new image contrast mechanism during acquisition, there is no reduction in acquisition time because the zero amplitude image contrast waveform segment portion must still be executed along with the rest of the MR imaging pulse sequence.

SUMMARY OF THE INVENTION

One embodiment of the invention relates to a method for interactively controlling the image contrast of a real-time magnetic resonance (MR) image. The method includes storing image contrast waveform segments, storing imaging waveform segments, selecting from the image contrast waveform segments and selecting from the imaging waveform segments. The method further includes constructing a MR imaging pulse sequence in real-time, acquiring MR data using the MR imaging pulse sequence in real-time, reconstructing the MR data in real-time, and displaying the newly acquired MR image.

Another embodiment of the invention relates to an interactive MR imaging system. The MR imaging system includes a MR imaging device configured to acquire and reconstruct MR data in real-time, an interface to permit an operator to select image contrast mechanisms, and a memory to store image contrast waveform segments and an imaging waveform segment. The sequence controller dynamically links the selected image contrast waveform segment to the imaging waveform segment to acquire a new image with the selected image contrast mechanisms.

Another embodiment of the invention relates to an interactive MR imaging system. The MR imaging system includes means for storing imaging waveform segments, means for storing image contrast waveform segments, means for selecting from the image contrast waveform segments, and means for selecting from the imaging waveform segments. The MR imaging system further includes means for constructing a MR imaging pulse sequence in real-time; means for acquiring MR data using the MR imaging pulse sequence in real-time, means for reconstructing the MR data in real-time, and displaying the newly acquired MR image.

Other principal features and advantages of the present invention will become apparent to those skilled in the art upon review of the following drawings, the detailed description and the appended claims.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 1:
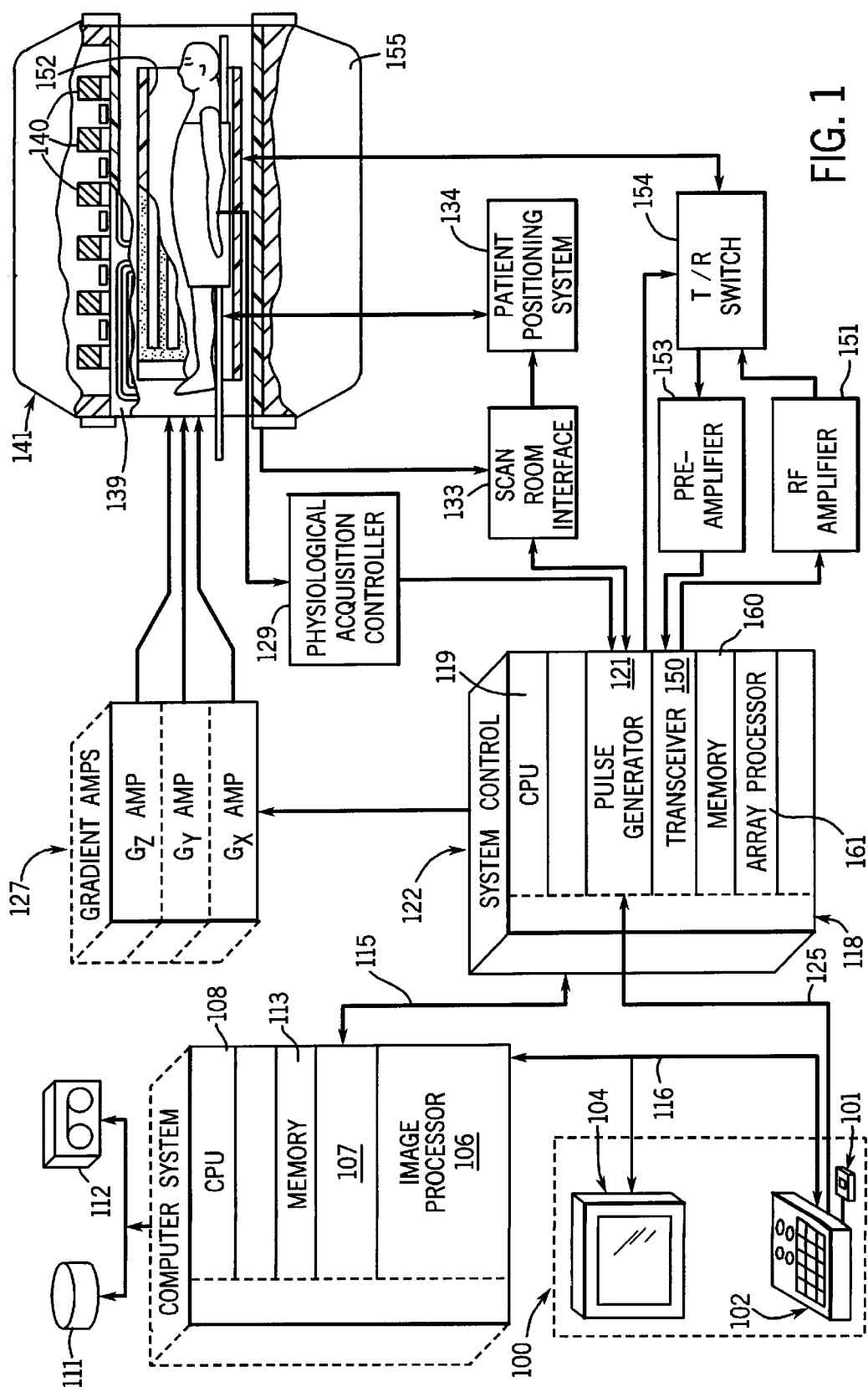
FIG. 1 is a block diagram of an embodiment of a MR imaging system according to the present invention.

Referring first to FIG. 1, there is shown the major components of a preferred MRI system which incorporates the present invention. The operation of the system is controlled from an operator console 100 which includes an input device 101, a control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152.

A transceiver module 150 in the system control 122 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
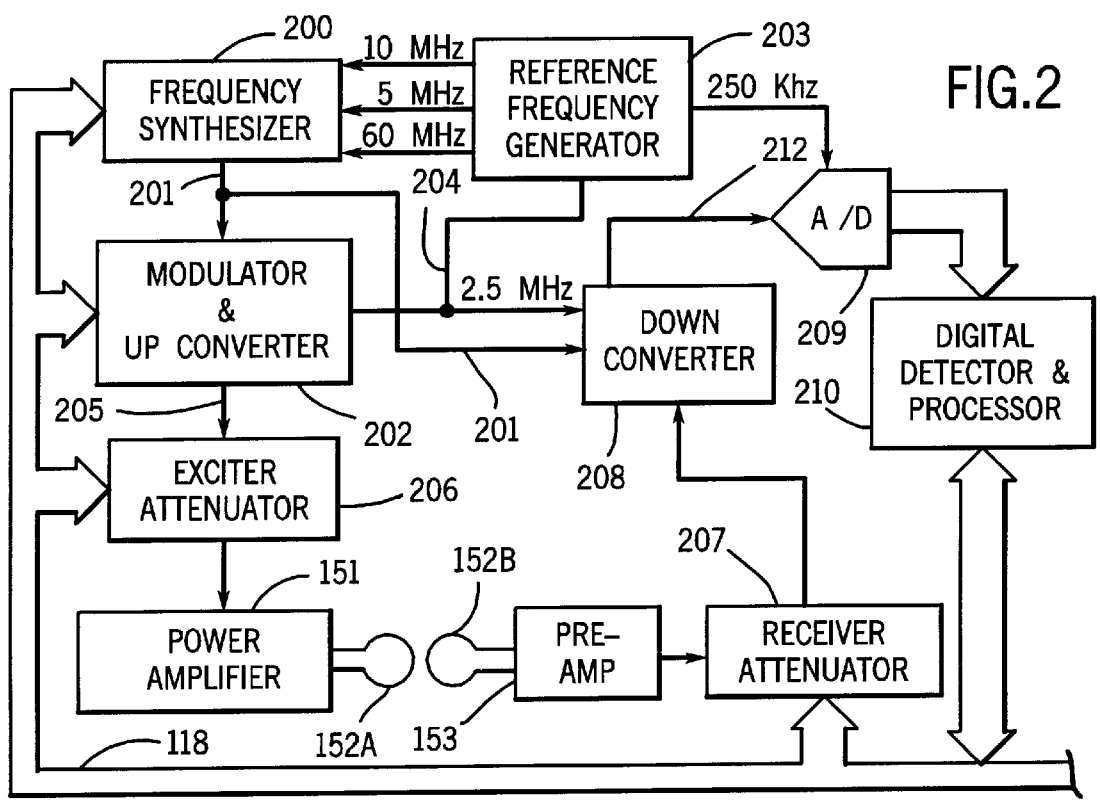
FIG. 2 is an electrical block diagram of the transceiver which forms part of the MR imaging system of FIG. 1.

Referring particularly to FIGS. 1 and 2, the transceiver 150 produces the RF excitation field Bi through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

In one embodiment of the present invention, an operator interactively controls the image contrast of an MR image prior to its acquisition or an MR image during its acquisition. Such interactive image contrast control is accomplished from the operator console 100 (also referred to as the operator interface) using the input device 101. The input device 101 is selected from a group including, but not limited to, a mouse, a joystick, a keyboard, a trackball, a touch screen, a light wand, and a voice control. The MR imaging system of the present invention is capable of imaging in any desired orientation within the structure of interest and is equipped to perform both real-time acquisitions and non real-time acquisitions. In particular, real-time refers to continuous acquisition and reconstruction of MR image data as rapidly as it is acquired and displayed in approximately one second or less, as constrained by system performance.

Figure 3:
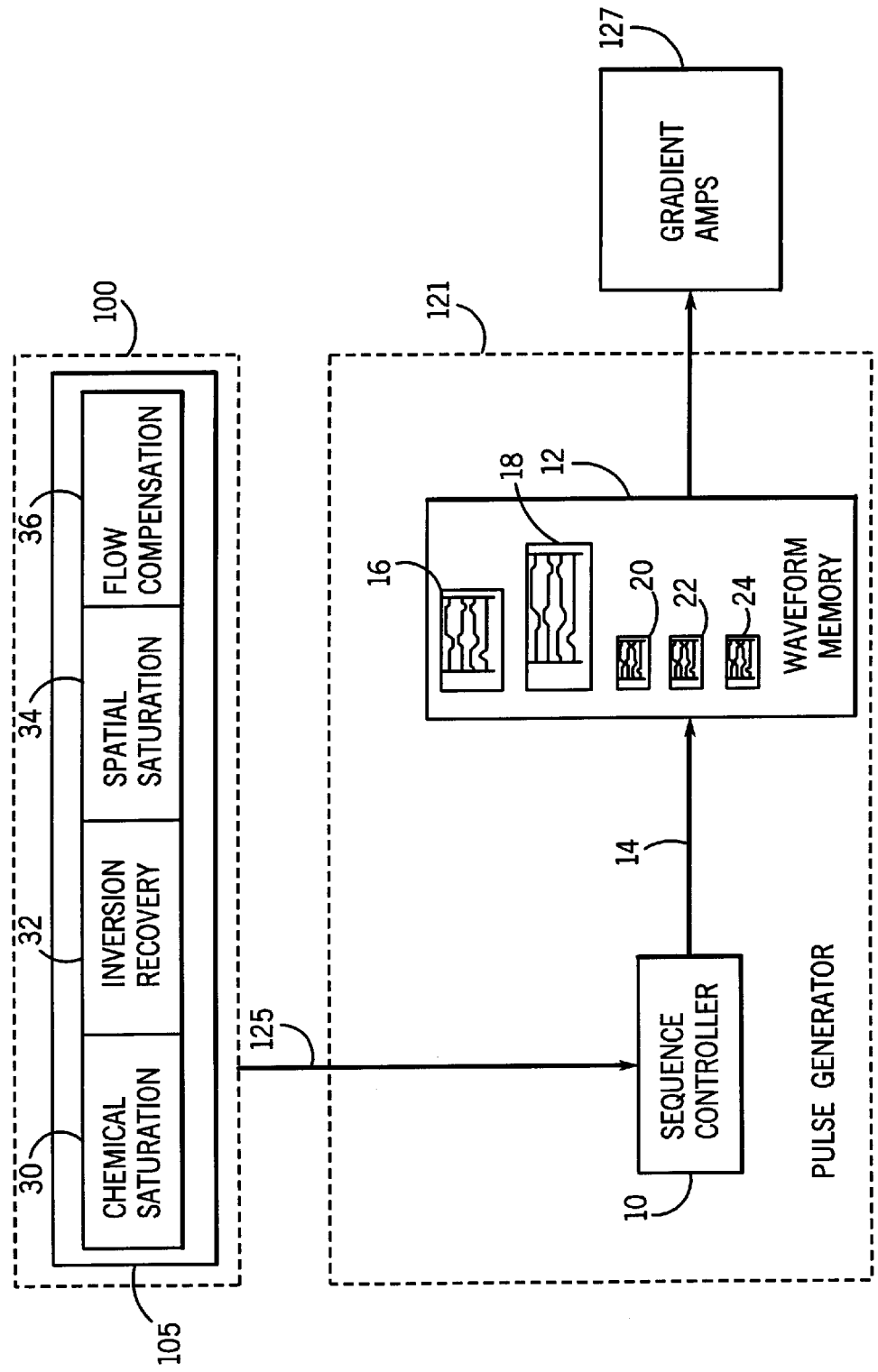
FIG. 3 is a more detailed block diagram of the pulse generator which forms part of the MR imaging system of FIG. 1.

FIG. 3 shows the major components used in an embodiment of the present invention. Pulse generator module 121 includes a sequence controller 10 which connects to a waveform memory 12 through a communication link 14. A graphical user interface 105 and MR images of the structure of interest (not shown in FIG. 3) are displayed on the display 104 of the MR imaging system. The operator interacts with the graphical user interface 105 using the input device 101. The graphical user interface 105 includes a chemical saturation icon 30, a inversion recovery icon 32, a spatial saturation icon 34, and a flow compensation icon 36. The link 125 connecting the operator console 100 to the pulse generator module 121 communicates image contrast controls from the operator console 100 to the sequence controller 10.

Waveform memory 12 stores multiple sets of RF and gradient waveform segments, each set corresponding to a distinct imaging mechanism or image contrast mechanism. Each set of RF and gradient waveform segments is assigned a distinct memory address in waveform memory 12 such that each set of RF and gradient waveform segments is accessible from waveform memory 12. In the preferred embodiment, imaging waveform segments, corresponding to imaging mechanisms, include a set of base imaging waveform segment 16 and a set of flow compensation imaging waveform segment 18. Image contrast waveform segments, corresponding to image contrast mechanisms, include a set of chemical saturation waveform segment 20, a set of inversion recovery waveform segment 22, and a set of spatial saturation waveform segment 24. It should be understood that the waveforms depicted in the figures are for illustration purposes only and do not is represent the actual waveforms in waveform memory 12.

In another embodiment of the present invention, image contrast mechanisms available in the MR imaging system, and correspondingly sets of waveform segments stored in waveform memory 12, can also include, but is not limited to: variable TE, variable TR, variable receiver bandwidth, variable flip angle, variable spatial resolution, field of view, slice thickness, slice spacing, multiple slices, multiple passes, no-phase-wrap, asymmetric field of view, fractional Ky (legacy-fractional matrix sampling), fractional Kx (legacy-fractional echo), velocity encoding, respiratory compensation, cardiac compensation, multiple repetitions (legacy-multi-phase), and phase contrast.

In detail, the preferred embodiment of the present invention uses real-time MR imaging. To interactively prescribe the image contrast in real-time, the operator selects the desired image contrast mechanism by "clicking" on icon 30, 32, or 34 on the graphical user interface 105 (for example, icon 30 for chemical saturation). The operator also selects one imaging mechanism. In the preferred embodiment, the operator selects the flow compensation mechanism by clicking on the flow compensation icon 36, or the base imaging mechanism by not clicking on any imaging waveform segment icons. Thus, the base imaging waveform segment, corresponding to the base imaging mechanism, is the default imaging mechanism.

Figure 4:
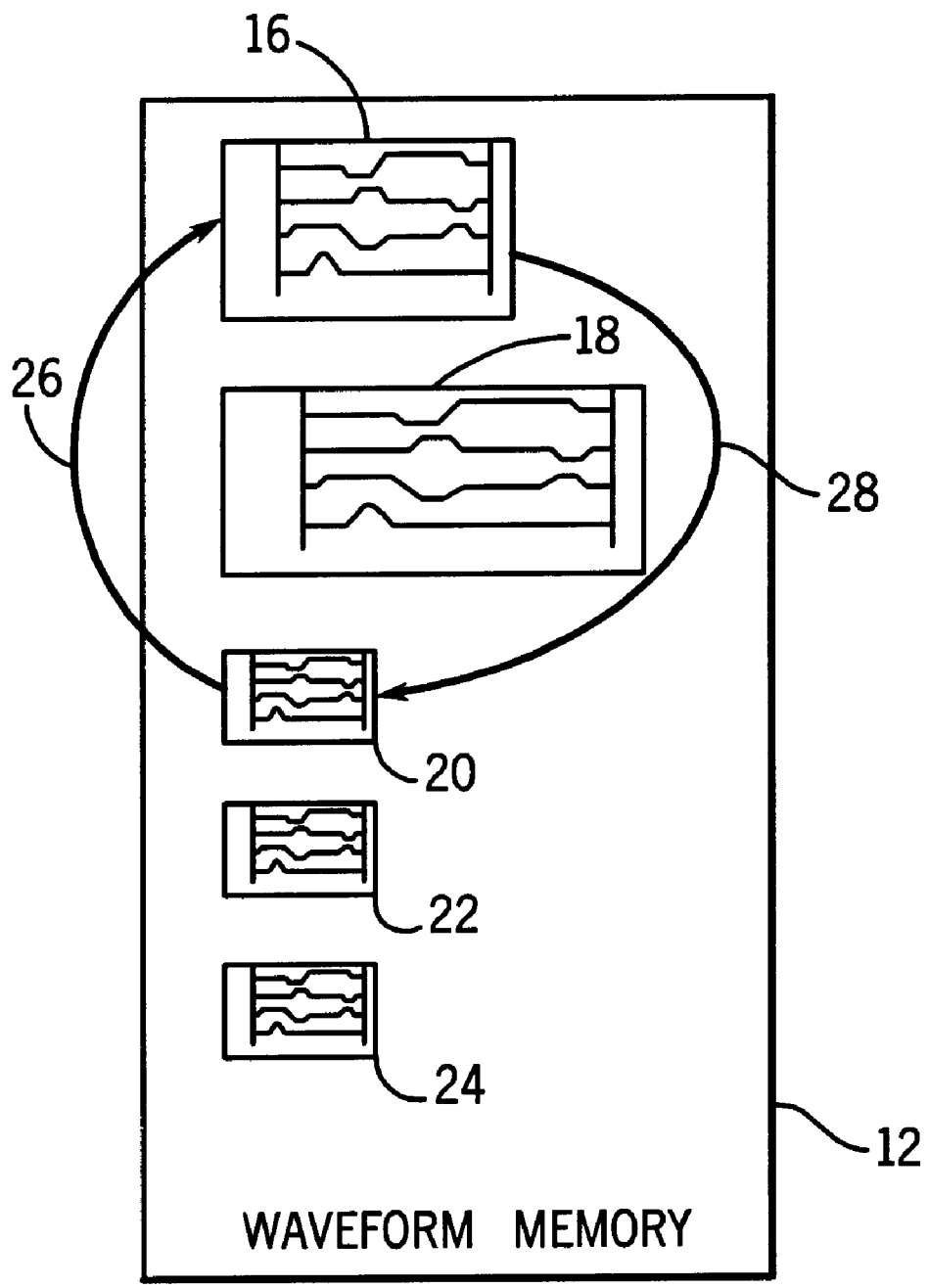
FIG. 4 is a block diagram of the waveform memory which forms part of the MR imaging system of FIG. 1.

Sequence controller 10 receives the operator's selection(s) via link 125 from the operator console 100. The sequence controller 10 first accesses the image contrast waveform segment corresponding to the selected image contrast mechanism (continuing the example, chemical saturation waveform segment 20). Second, the sequence controller 10 accesses the selected imaging waveform segment (continuing the example, base imaging waveform segment 16) almost instantaneously in time, to dynamically link 26 selected image contrast waveform segment to the selected imaging waveform segment as shown in FIG. 4. In this manner, a dynamically linked MR imaging pulse sequence, comprised of the selected image contrast waveform segment followed by the selected imaging waveform segment, is constructed. Then the sequence controller 10 applies this dynamically linked MR imaging pulse sequence to the gradient amplifier system 127 to be executed or "played out" such that MR data can be acquired.

Next, the sequence controller 10 accesses the selected image contrast waveform segment (continuing the example, chemical saturation waveform segment) again, almost instantaneously in time, to construct the next dynamically linked 28 MR imaging pulse sequence. Access and execution of the selected image contrast waveform segment and the selected imaging waveform segment occurs repeatedly in this cyclic manner with appropriate modifications to the MR imaging pulse sequence at each cycle or repetition to acquire enough MR data in accordance with the resolution of the proposed MR image to be displayed. For example, an MR image with 256 phase encoding views would require the MR imaging pulse sequence to be executed 256 times in standard spin-warp MR imaging. The final result, after acquisition and reconstruction in real-time, is a MR image with the selected image contrast mechanism (in this example, chemical saturation).

In the preferred embodiment of the present invention, the selected image contrast waveform segment comprises the first portion of the constructed MR imaging pulse sequence. Moreover, the operator has the option of selecting more than one image contrast mechanism for a proposed MR image or not selecting any image contrast mechanisms for a proposed MR image. In the first case of selecting more than one image contrast mechanism for a proposed MR image, the dynamically linked MR imaging pulse sequence would contain all the selected image contrast waveform segments first following by the imaging waveform segment. The order of the image contrast waveform segments is determined by predetermined order or some appropriate algorithm already prescribed in the MR imaging system. In the second case of not selecting any imaging contrast mechanism for a proposed MR image, the dynamically linked MR imaging pulse sequence would only contain the selected imaging waveform segment. Hence, the advantage of independently invoking waveform segments to construct the MR imaging pulse sequence, as needed at run-time, becomes apparent in real-time imaging where minimal scan time is of the essence.

To further interactively prescribe the image contrast in real-time, the operator can select the desired image contrast and/or imaging mechanisms prior to initiating scanning or the operator can select the desired image contrast and/or imaging mechanisms while a scan is in progress. When the operator selects the desired image contrast and/or imaging mechanisms while a scan is in progress, the MR imaging system can instantaneously (i.e. in less than 100 milliseconds) replace the current sets of waveform segments with new sets of waveform segments corresponding to the newly selected mechanisms. Although not shown in the figures, the graphical user interface 105 can additionally include icons for the operator to prescribe how the MR imaging system should deal with the scan in progress. Alternatively, the MR imaging system can have prescribed rules which dictate what should be done to the scan in progress. For example, the MR imaging system can halt the current scan and/or halt the current MR image from being displayed; instead the sequence controller 10 can immediately initiate a new scan with the newly selected waveform segments. Alternatively, the MR imaging system can complete the current scan in progress and display the current MR image acquired; then the sequence controller 10 can initiate a new scan with the newly selected waveform segments. In still another alternative, the newly selected waveform segments can be used to finish the current scan in progress such that the resulting MR image is a conglomeration or hybrid of the current scan with the current waveform segments and the new scan with the newly selected waveform segments.

To still further interactively prescribe the image contrast in real-time, the operator can directly modify the image contrast in real-time. Although not shown in the figures, the graphical user interface can include icons configured to allow the operator to directly modify individual gradient and RF amplitudes, pulse widths, and/or relative timing within each waveform segment. The direct modification can be accomplished graphically (i.e. slide bar icons) or explicitly (i.e. specific numerical values). Thus, in this manner, the present invention provides interactive and acquisition time saving image contrast controls to the operator.

It should be apparent that there has been provided in accordance with one embodiment of the present invention an interactive image contrast prescription control for use in real-time MR imaging. While the embodiments illustrated in the FIGS. And described above are presently preferred, it should be understood that these embodiments are offered by way of example only. Accordingly, the invention is not limited to a particular embodiment, but extends to alternatives, modifications, and variations that nevertheless fall within the spirit and scope of the appended claims.

What is claimed is:

1. A method for interactively controlling the image contrast of a real-time magnetic resonance (MR) image produced in a MR system, comprising:
    a) storing a plurality of image contrast waveform segments in a waveform memory of the MR system;
    b) storing at least one imaging waveform segment in the waveform memory of the MR system;
    c) selecting from the plurality of image contrast waveform segments stored in the waveform memory;
    d) selecting from the at least one imaging waveform segment stored in the waveform memory;
    e) constructing a MR pulse sequence in real-time by dynamically connecting the selected image contrast waveform segment to the selected imaging waveform segment at run-time;
    f) acquiring MR data using the dynamically connected MR pulse sequence in real-time;
    g) reconstructing the MR data acquired in real-time; and
    h) displaying the newly acquired MR image as the current image.

2. The method of claim 1, wherein storing a plurality of image contrast waveform segments includes storing waveform segments from a group including an inversion recovery waveform segment, a chemical saturation waveform segment, and a spatial saturation waveform segment.

3. The method of claim 1, wherein storing at least one imaging waveform segment includes storing a flow compensation waveform segment.

4. The method of claim 1, wherein steps (c) and (d) are performed by an input device selected from a group including a mouse, a joystick, a keyboard, a trackball, a touch screen, a light wand, and a voice control.

5. The method of claim 1, further comprising repeating steps (e) to (h) a plurality of repetitions with appropriate modifications to the MR pulse sequence at each repetition to acquire enough MR data in accordance with the resolution of the proposed MR image to be displayed.

6. The method of claim 1, wherein selecting from the plurality of image contrast waveform segments and selecting from at least one imaging waveform segment includes providing a default base imaging waveform segment stored in the waveform memory when no explicit selection is made.

7. The method of claim 1, wherein selecting from the plurality of image contrast waveform segments stored in the waveform memory includes selecting more than one image contrast waveform segments.

8. The method of claim 1, wherein constructing a MR pulse sequence includes the sequence controller sequentially accessing the selected plurality of contrast waveform segments in the waveform memory then the selected imaging waveform segment in the waveform memory.

9. The method of claim 8, wherein constructing a MR pulse sequence further includes dynamically connecting the selected imaging waveform segment to the end of the plurality of image contrast waveform segments selected.

10. The method of claim 1, further comprising the step of halting the current acquisition of MR data, the acquisition commencing with at least one current waveform segment, which is in progress at the time when a selection of at least one waveform segment is made on the MR system and halting the displaying of the current MR image resulting therefrom, such that steps (e) to (h) for the selected at least one waveform segment can commence.

11. The method of claim 10, further comprising instantaneously replacing the at least one current waveform segment with the selected at least one waveform segment prior to step (e).

12. The method of claim 1, further comprising completing the acquisition of MR data, the acquisition commencing with at least one current waveform segment, which is in progress at the time when a selection of at least one waveform segment is made in the MR system and further completing the displaying of the MR image resulting therefrom, then commencing steps (e) to (h) with the selected at least one waveform segment.

13. The method of claim 12, further comprising instantaneously replacing the at least one current waveform segment with the selected at least one waveform segment prior to step (e).

14. The method of claim 1, further comprising the step of instantaneously replacing at least one current waveform segment of the current MR data acquisition in progress with an at least one new waveform segment, wherein the at least one new waveform segment is selected while the current MR data acquisition is in progress, and completing the current MR data acquisition in progress with the at least one new waveform segment such that the resulting MR image is a hybrid image of the at least one current waveform segment and the at least one new waveform segment scan.

15. The method of claim 1, further comprising modifying the MR pulse sequence from a modification step selected from a group including modifying an individual gradient amplitude comprising the MR pulse sequence, modifying a radio frequency (RF) amplitude comprising the MR pulse sequence, modifying a pulse width comprising the MR pulse sequence, and modifying a relative timing within the MR pulse sequence.

16. An interactive magnetic resonance (MR) imaging system, comprising:
   a MR imaging device configured to perform an MR scan in real-time of a current imaging section using an MR pulse sequence;
   an operator interface coupled to the MR imaging device to permit an operator to select from a plurality of waveform segment mechanisms at any time during the MR scan;
   a memory coupled to the MR imaging device to store the plurality of waveform segment mechanisms, wherein each of the plurality of waveform segment mechanisms is distinctly addressable such that each of the waveform segment mechanisms can be independently accessed from the memory; and
   a sequence controller coupled to the memory and configured to dynamically connect the selected waveform segment mechanisms together to construct the MR pulse sequence, wherein the selected waveform segment mechanisms being connected are in accordance with the latest selection made on the operator interface.

17. The interactive MR imaging system of claim 16 wherein the plurality of waveform segment mechanisms include at least one image contrast waveform segment and at least one imaging waveform segment.

18. The interactive MR imaging system of claim 16 wherein the interface includes a plurality of icons on a display screen for displaying the available image contrast mechanisms.

19. The interactive MR imaging system of claim 16, wherein the memory stores a flow compensation imaging waveform segment.

20. The interactive MR imaging system of claim 17, wherein the at least one image contrast waveform segment includes at least one of a spatial saturation waveform segment, a chemical saturation waveform segment, and an inversion recovery waveform segment.

21. An interactive magnetic resonance (MR) imaging system, comprising:
   a) means for storing a plurality of image contrast waveform segments in a waveform memory of the MR system;
   b) means for storing at least one imaging waveform segment in the waveform memory of the MR system;
   c) means for selecting from the plurality of image contrast waveform segments stored in the waveform memory;
   d) means for selecting from the at least one imaging waveform segment stored in the waveform memory;
   e) means for constructing a MR pulse sequence in real-time by dynamically connecting the selected image contrast waveform segment to the selected imaging waveform segment at run-time;
   f) means for acquiring MR data using the dynamically connected MR pulse sequence in real-time;
   g) means for reconstructing the MR data acquired in real-time; and
   h) means for displaying the newly acquired MR image as the current image.

22. The system of claim 21, wherein means for storing a plurality of image contrast waveform segments includes waveform segments from a group including an inversion recovery waveform segment, a chemical saturation waveform segment, and a spatial saturation waveform segment.

23. The system of claim 21, wherein means for storing at least one imaging waveform segment includes a flow compensation waveform segment.

24. The system of claim 21, wherein means for selecting is an input device selected from a group including a mouse, a joystick, a keyboard, a trackball, a touch screen, a light wand, and a voice control.

* * * * *